(12) United States Patent
Laermer

(10) Patent No.: US 7,312,553 B2
(45) Date of Patent: Dec. 25, 2007

(54) MICROMECHANICAL COMPONENT AND METHOD FOR PRODUCING SAME

(75) Inventor: Franz Laermer, Weil der Stadt (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/492,896

(22) PCT Filed: Sep. 5, 2002

(86) PCT No.: PCT/DE02/03283

§ 371 (c)(1),
(2), (4) Date: Oct. 13, 2004

(87) PCT Pub. No.: WO03/037782

PCT Pub. Date: May 8, 2003

(65) Prior Publication Data

US 2005/0052092 A1    Mar. 10, 2005

(30) Foreign Application Priority Data

Oct. 20, 2001  (DE)  ................. 101 52 254

(51) Int. Cl.
*H01L 41/08* (2006.01)
(52) U.S. Cl. .................. 310/312; 310/311; 73/514.01
(58) Field of Classification Search ................ 310/328, 310/309, 311, 312, 313; 73/514.16, 504.03, 73/514.01, 514.36; 437/225, 901; *H01L 41/08*
See application file for complete search history.

(56) References Cited

U.S. PATENT DOCUMENTS

| 5,506,175 A | 4/1996 | Zhang et al. |
| 5,627,317 A | 5/1997 | Offenberg et al. |
| 5,756,901 A | 5/1998 | Kurle et al. |
| 6,078,016 A * | 6/2000 | Yoshikawa et al. ......... 200/181 |
| 6,079,873 A | 6/2000 | Suehle et al. |
| 6,121,552 A * | 9/2000 | Brosnihan et al. .......... 174/253 |
| 6,151,964 A | 11/2000 | Nakajima |
| 6,291,875 B1 | 9/2001 | Juneau et al. |
| 6,388,300 B1 * | 5/2002 | Kano et al. ............... 73/514.36 |

(Continued)

FOREIGN PATENT DOCUMENTS

DE    42 41 045    5/1994

(Continued)

OTHER PUBLICATIONS

Devoe D. L. et al., "Surface Mocromachined Piezoelectric Accelerometers (Pixels)," Journal of Microelectromechanical Systems, IEEE Inc. New York, US, Bd. 10, Nr. 2, Jun. 2001, pp. 180-186, XP001123588.

(Continued)

*Primary Examiner*—J. San Martin
(74) *Attorney, Agent, or Firm*—Kenyon & Kenyon LLP

(57) ABSTRACT

A micromechanical component and a method for producing the component are provided. The micromechanical component includes a substrate and a micromechanical functional layer of a first material provided over the substrate. The functional layer has a first and second regions, which are connected by a third region of a second material, and at least one of the regions is part of a movable structure, which is suspended over the substrate.

10 Claims, 9 Drawing Sheets

U.S. PATENT DOCUMENTS 6,472,794 B1 * 10/2002 Shibaike et al. ............ 310/309
6,960,488 B2 * 11/2005 Brosnihan et al. ............ 438/52
7,052,623 B1 * 5/2006 Becker et al. ................ 216/67

FOREIGN PATENT DOCUMENTS

| DE | 43 17 274 | 12/1994 |
|---|---|---|
| DE | 44 20 962 | 12/1995 |
| DE | 197 04 454 | 8/1998 |
| DE | 198 47 455 | 4/2000 |
| DE | 100 03 066 | 8/2000 |
| EP | 0 578 228 | 1/1994 |
| EP | 0 981 052 | 2/2000 |
| GB | 2 290 413 | 6/1995 |
| WO | WO 98 57 529 | 12/1998 |

OTHER PUBLICATIONS

Yoon Y S et al. "Fabrication processes and characteristics of microelectromechanical system using PZT films "Materials for Mechanical and Optical Microsystems Symposium, Boston, MA, USA, Dec. 4-5, 1996, pp. 143-148, XP009019665.

* cited by examiner

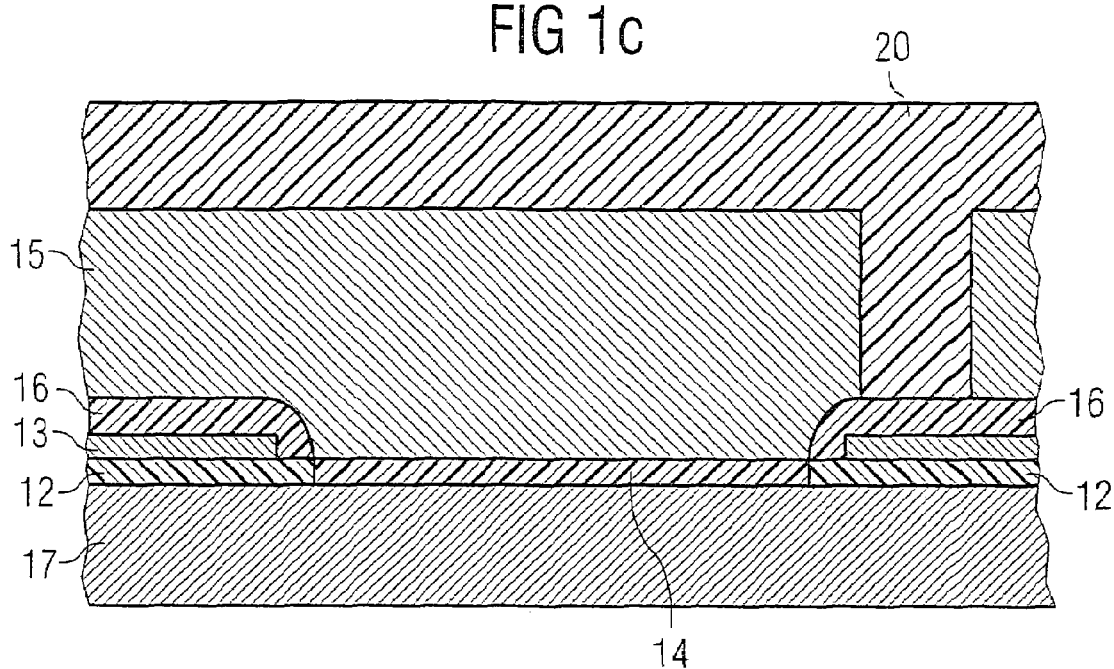
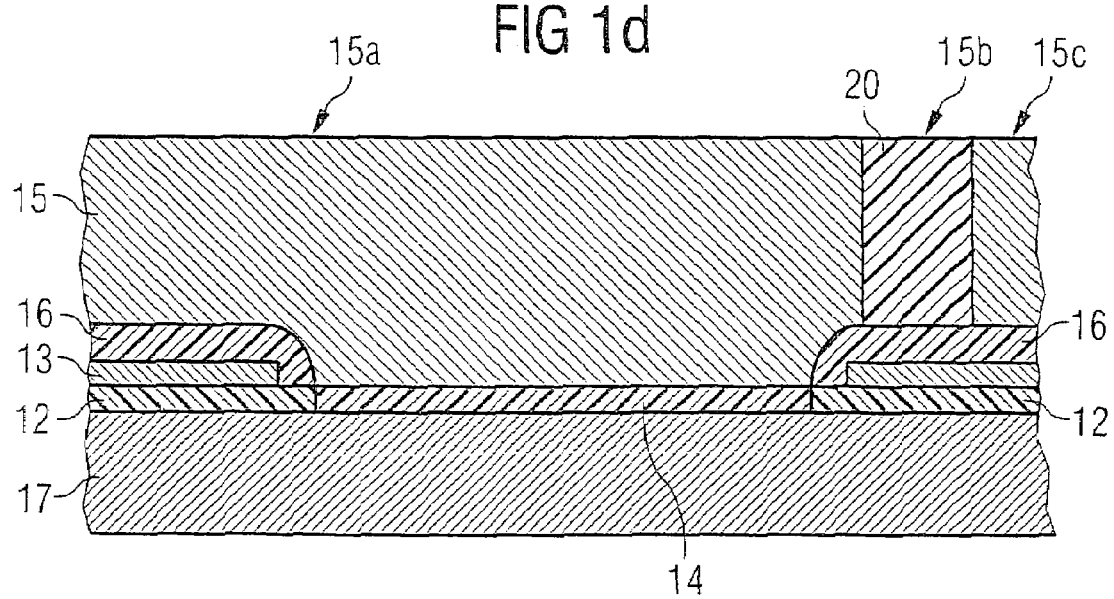

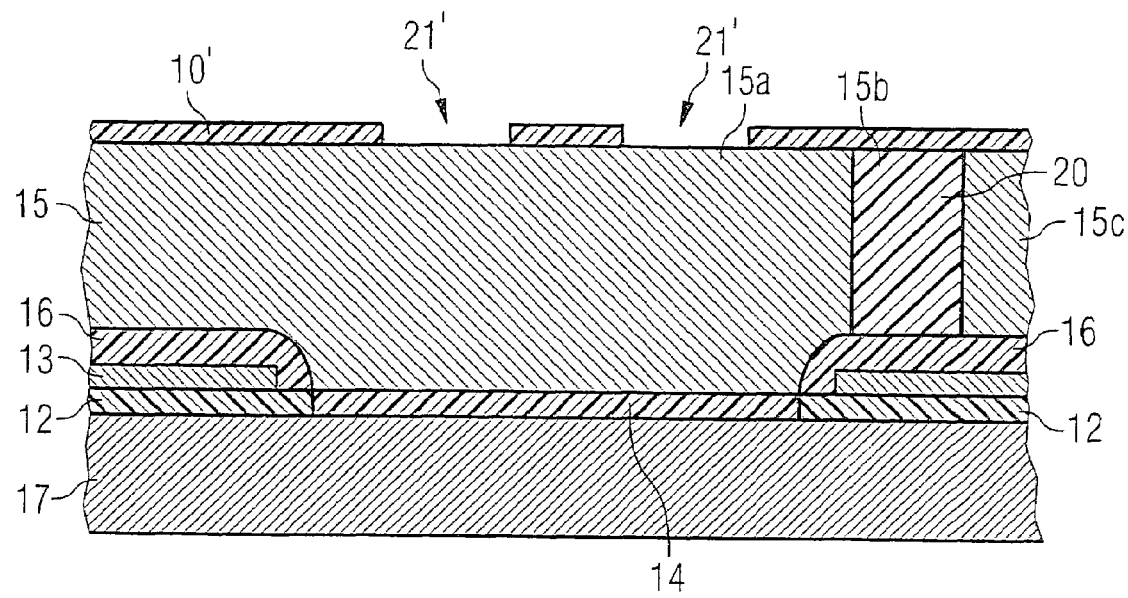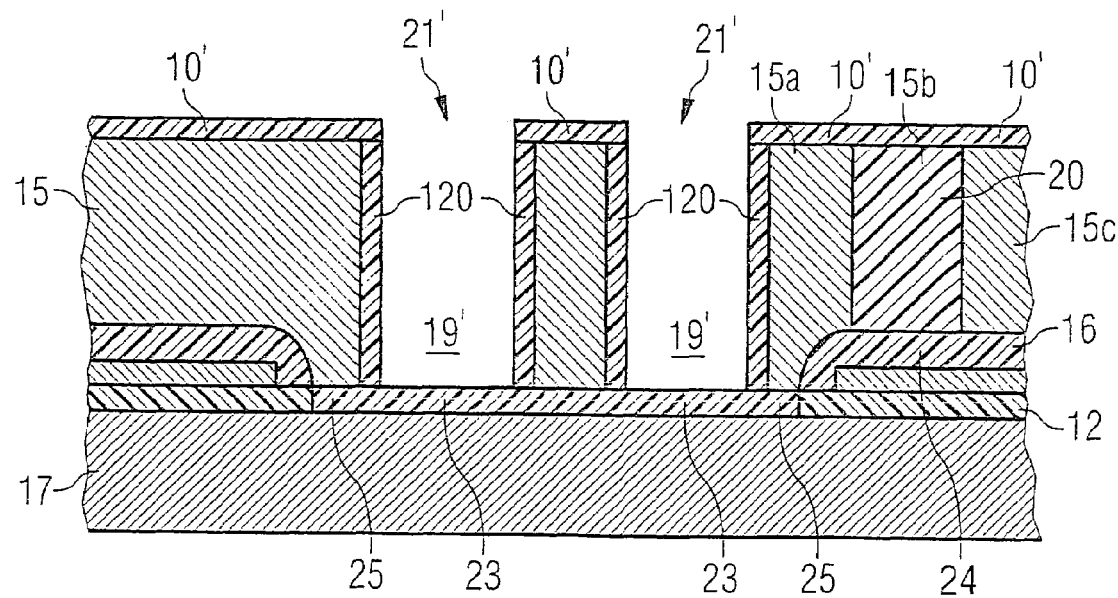

MICROMECHANICAL COMPONENT AND METHOD FOR PRODUCING SAME

FIELD OF THE INVENTION

The present invention is directed to a micromechanical component and to a method for its manufacture.

BACKGROUND INFORMATION

In surface micromechanics, sensor elements are delineated out of a mono- or polycrystalline, active silicon surface layer, and rendered freely movable by a sacrificial layer technique, i.e., by the removal of an $Sio_2$ sacrificial layer disposed underneath the structures. For a highly precise pattern delineation of the silicon surface layer, a plasma etching method of the type described in the published German patent document DE 4241045 may be used. To remove the $Sio_2$ sacrificial layer, a hydrofluoric acid vapor etching process may be used, as described, for example, in the published German patent document DE 4317274 and the published German patent document DE 19704454, respectively. A preferred general process for manufacturing surface-micromechanical sensors of this kind is explained, for example, in U.S. Pat. No. 5,756,901. In addition, isotropic silicon sacrificial layer etching technique is described in conjunction with the anisotropic trench technique in the published German patent document DE 4420962 and in the published U.K. patent document GB 2290413, respectively.

Important sensor applications include acceleration sensors and, above all, rotation-rate sensors. Thus, rotation-rate sensors have been designed in accordance with various linear oscillator principles and in accordance with various torsional resonator principles. These rotation-rate sensors are oscillatory structures designed as spring-mass systems, which are excited by electrostatic comb drives into a continuous oscillatory motion of a constant amplitude, and which are evaluated by capacitive sensing structures.

All these structures have in common that the freely movable sensor element is fabricated from one piece of silicon, i.e., the entire system of springs and masses is electrically interconnected and, therefore, is inevitably at the same potential. As a consequence, when working with rotation-rate sensors, for example, there is a harmful feedover, or leakage, of drive voltages into the detector circuit, since, in the absence of a galvanic decoupling within the oscillatory structure, the drive voltages and the detection signals act on one and the same structure.

Often, the decoupling from the drive voltage is accomplished by a downstream spectral filtering, by applying current compensation principles (oppositely directed drive voltages at two comb drives with compensation of the displacement currents), or by a temporal selection process on the basis of switched capacitor principles. In any case, the noise properties of the sensor system deteriorate because of the feedover or due to the countermeasures taken.

In the known methods, a hydrofluoric acid-containing medium in the form of aqueous or vaporous hydrofluoric acid is used for the sacrificial layer etching of the $Sio_2$ layer located underneath the active structures, and the approach which provides for intercalating isolation structures into the functional layer has failed so far, because such isolation structures are destroyed during the sacrificial layer etching. In the same way as the actual $Sio_2$ sacrificial layer, the refill oxide in the isolation trenches is also attacked by the hydrofluoric acid. Particularly when hydrofluoric acid vapor it used, it is virtually impossible to protect functional isolation oxides.

SUMMARY

The micromechanical component according to the present invention has the advantage over the known approach in that the functional layer is able to be subdivided into regions having different mechanical and/or electrical properties. For example, the present invention enables parts of the overall structure, e.g., sensing and drive structures, to be galvanically decoupled from one another in that isolation structures for electrical decoupling and isolation of corresponding substructures within the movable structure are provided within the functional layer.

To produce electrical isolation structures, isolation trenches are introduced in order to partition the sensor structure into a plurality of substructures. To mechanically interconnect these substructures in such a way that they are electrically insulated from one another, for example, the isolation trenches are filled again with a highly insulating material of, for example, silicon dioxide. Thus, one is able to produce a mechanically cohesive structure made up of partial segments that are electrically insulated from one another.

The present invention advantageously makes use of an alternative sacrificial layer technique that is based on the selective removal of sacrificial silicon regions out of a reactive gas phase. For this purpose, highly reactive fluorine compounds, such as $XeF_2$, $ClF_3$, $BrF_3$, $IF_3$, $IF_5$ etc., or fluorine radicals from a plasma discharge are used, which spontaneously etch exposed silicon, but are very selective to non-silicon and do not attack it. In particular, oxide layers of these substances are not significantly attacked, so that functional oxides, such as the refill oxide, of the isolation trenches remain completely intact.

During the sacrificial silicon etching, the active silicon structures are protected, preferably on all sides, by suitable passivation layers (oxide layers, Teflon-type layers, photoresist). For that reason, these passivation layers should also be deposited on the side walls of the sensor structures. If a Teflon-type passivation is planned, then the passivation step of the plasma etching process for selective deposition on the side walls is excellently suited.

By applying this new sacrificial layer technique according to the present invention, it is possible to manufacture sensors composed of substructures which are laterally electrically insulated from one another, and thus to provide a decoupling of drive zones and sensing zones in rotation-rate sensors. The result is that these sensors are substantially improved, and the application spectrum of the surface micromechanics technology is substantially broadened, so that functionality is enhanced.

Moreover, instead of an isolation oxide, a piezoelectric material may be used to fill the isolation trenches. As electrodes, silicon substructures on both sides of the piezoelectric material are then used, for example. Thus, within the sensor structure, mechanical forces may be converted into electric signals, for example, which, in turn, may be tapped off at the substructures which are electrically insulated from one another. Known piezoelectric layer materials are, for example, Zno, AIN, PZT, etc. Zno and AIN, in particular, are precipitable as thin layers in semiconductor-oriented processes. These piezoelectric materials convert mechanical forces into electric voltages and vice versa, so that piezoelectric actuators are also able to be formed within an active structure.

The advantage of piezoelectric signal conversion in a sensor lies in the relatively high, attainable signal voltages and the low source impedances. From this, one derives the benefit of enhanced sensor sensitivity and sensor resolution in the context of rotation-rate sensors. When it comes to an actuator, the benefit derived is the relatively substantial force or path, given a relatively low drive voltage. Here as well, the highly selective isotropic silicon sacrificial layer technique makes it possible to produce novel components having enhanced functionality.

In an example embodiment of the present invention, an insulating layer is provided between the substrate and the functional layer.

In an example embodiment of the present invention, the third region of a second material constitutes part of the movable structure.

Another example embodiment provides for the first material to be polysilicon, and for the second material to be an insulating material, e.g., silicon dioxide.

Yet another example embodiment provides for the first material to be polysilicon, and for the second material to be a piezoelectric material.

In another example embodiment, a seismic mass is formed in the micromechanical functional layer and has a comb structure provided thereon as a driving mechanism, the third region being provided to electrically insulate the comb structure from the seismic mass.

In yet another example embodiment, a ring structure is formed in the micromechanical functional layer, the third region being formed as a piezoelectric region.

Another example embodiment provides for the ring structure to be surrounded by a continuous third region, to which a plurality of torsion springs is connected.

In yet another example embodiment, the ring structure is surrounded by a third region, which has a plurality of partial regions that are not interconnected and to each of which one of a plurality of torsion springs is connected.

Another example embodiment provides for the ring structure to be part of a ring gyro.

In another example embodiment, uninterrupted, traversing trenches are formed in the functional layer for forming the movable structure; the side walls of the trenches are subsequently coated with a protective layer; a part of the functional layer is then rendered movable by providing an undercut etching region; in the process, the regions of the undercut etching region being protected by the insulating layer and the side walls of the trenches by the protective layer.

In yet another example embodiment, the protective layer is initially deposited in the entire trench and then removed from the trench bottom.

Another example embodiment provides for the planarization to be carried out using a chemical-mechanical polishing step.

BRIEF DESCRIPTION OF THE DRAWINGS

FIGS. 1a through 1g show schematic representations of various process stages of an example method for producing an example embodiment of a micromechanical component according to the present invention.

DETAILED DESCRIPTION

Figure 1A:
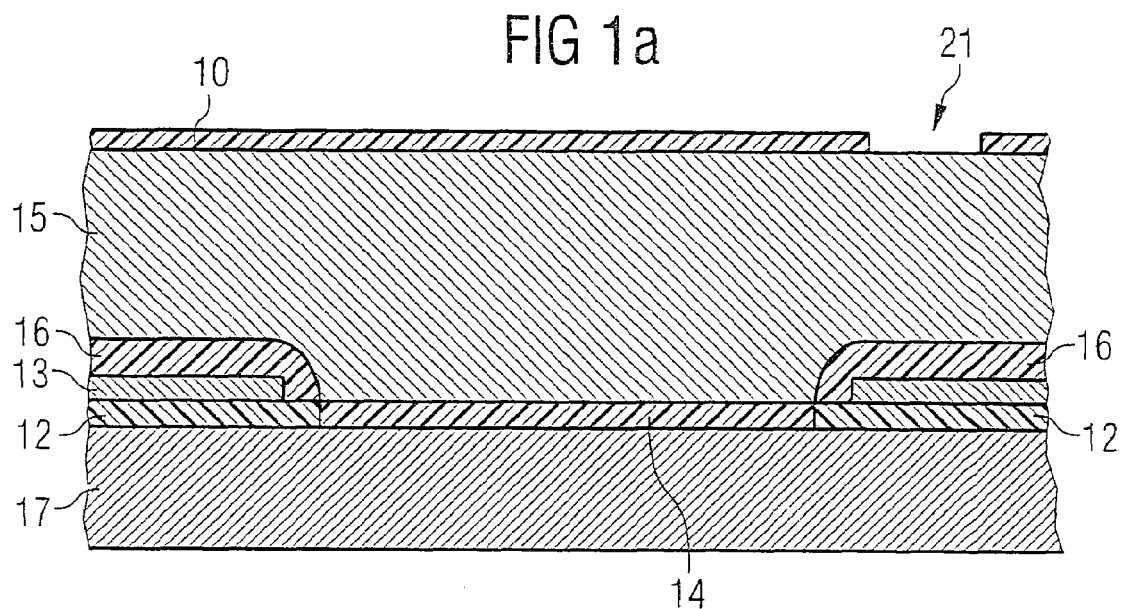

In the figures, the same reference numerals denote the same or functionally equivalent component parts. The present invention, although applicable to any micromechanical components, is explained in connection with a surface-micromechanical component, e.g., a rotation-rate sensor that is produced using silicon technology.

FIGS. 1a through 1g show schematic representations of various process stages of an example method for producing an example embodiment of a micromechanical component according to the present invention.

In FIG. 1a, reference numeral 17 denotes a silicon substrate, for example in the form of a silicon wafer. Regions of a first insulating layer 12 and a second insulating layer 14, disposed therebetween, in each instance of silicon dioxide, are deposited on silicon substrate 17. Situated on the regions of first insulating layer 12 is a delineated, conductive layer 13, which is covered, in turn, by a third insulating layer 16, likewise of silicon dioxide. Above third insulating layer 16 and second insulating layer 14, respectively, a functional layer 15 of conductive, heavily-doped polysilicon is provided. Above functional layer 15 is a photomask 10, in which an opening 21 is provided in the right section, above third insulating layer 16.

The manufacturing process for the structure shown in FIG. 1a is generally known in the technology of surface micromechanics.

Figure 1B:
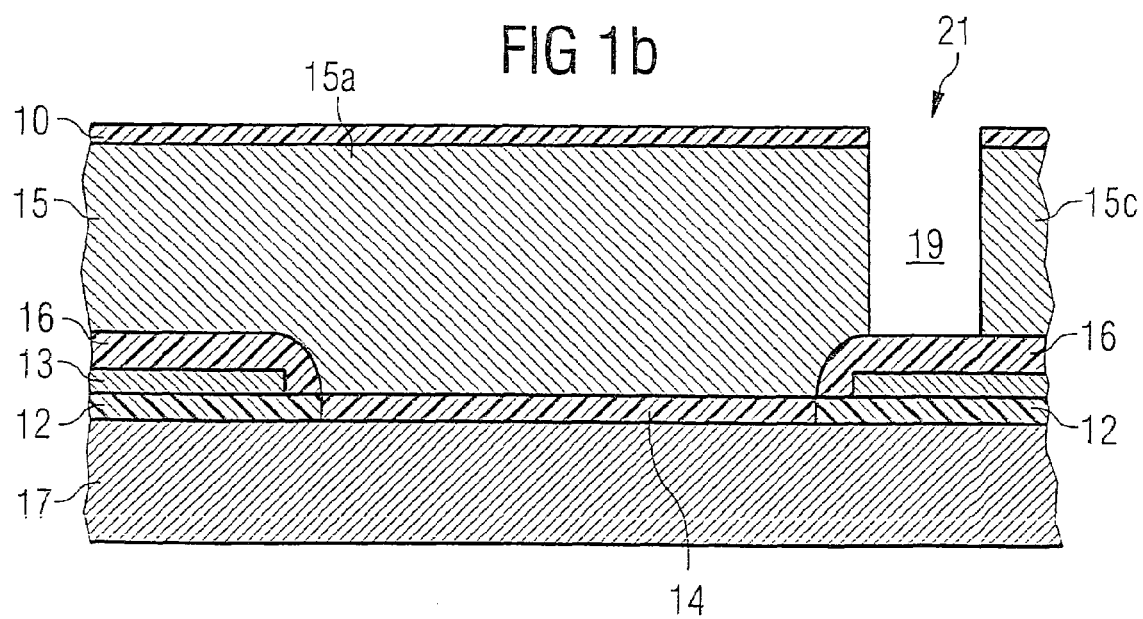

FIG. 1b shows the result of a first anisotropic plasma etching process, using photomask 10 having opening 21, which creates a trench 19 that completely cuts through functional layer 15 and stops at third insulating layer 16. In other words, the plasma etching process subdivides functional layer 15 into regions 15a and 15c.

In accordance with FIG. 1c, in a subsequent process step, trench 19 is completely filled with an isolation oxide (SiO2) 20, in that the isolation oxide in question is deposited over the entire surface area of the structure.

Isolation oxide 20 is subsequently completely ablated again from the wafer surface and, in fact, by a chemical-mechanical polishing step (CMP) or by back-etching the oxide layer. Consequently, isolation oxide 20 remains only in isolation trench 19, so that a planar surface of the resulting structure is formed in accordance with FIG. 1d. At this point, the filled trench forms a region 15b of functional layer 15, which joins regions 15a and 15c in a mechanically stable manner, but, in the present example, in such a way that they are electrically insulated from one another.

In a subsequent process step in accordance with FIG. 1e, a second photomask 10' is provided on the resulting structure. Not shown in FIG. 1e is a metallic coating, which is typically still situated on functional layer 15, underneath photomask 10'. If required, this metallic coating may also span the trenches filled with insulating material, for example.

Photomask 10' has openings 21' which are situated, inter alia, above second insulating layer 14. In a second anisotropic plasma process including alternating deposition and etching steps, in the area of openings 21', trenches 19' are etched, which extend to second insulating layer 14 that is typically only a few up to 100 nanometers thick.

The specified deposition steps cause a Teflon-type protective film 120 to selectively form on the side walls of trenches 19'. When insulating layers 12, 14, and 16, respectively, are reached, the anisotropic plasma etching process comes virtually to a complete standstill, since it is highly selective to silicon over silicon dioxide and, therefore, virtually does not etch silicon dioxide. Exposed regions 23 are located at the bottom of trenches 19'. This is shown in FIG. 1f.

Figure 1G:
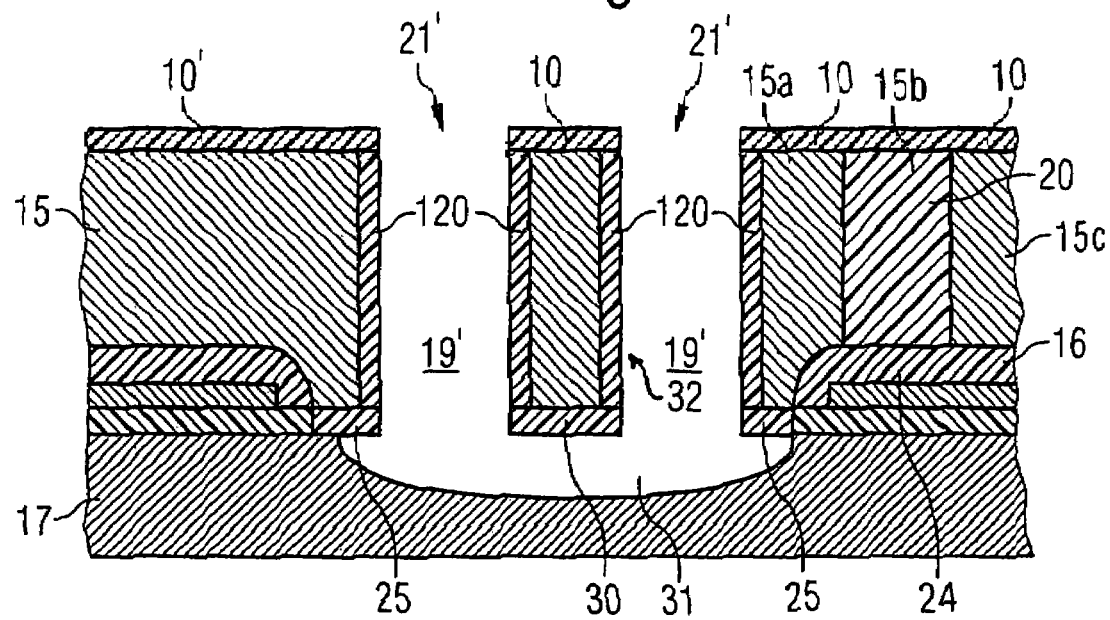

In accordance with FIG. 1g, in a further anisotropic plasma etching process for silicon oxide, exposed regions 23 of second insulating layer 14 are removed. Following removal of regions 23 of second insulating layer 14, an isotropic etching of silicon substrate 17 follows to produce an undercut-etching region 31. Thus, a movable structure 32 is able to be produced above undercut-etching region 31.

Region 30 of movable structure 32, made up of second insulating layer 14, together with regions 25 of second insulating layer 14, as well as Teflon-type protective layer 120, prevents a back-etching or a structural loss of functional layer 15 during the isotropic undercut etching in the silicon and ensures that etching is effectively carried out only into the silicon substrate.

Figure 2:
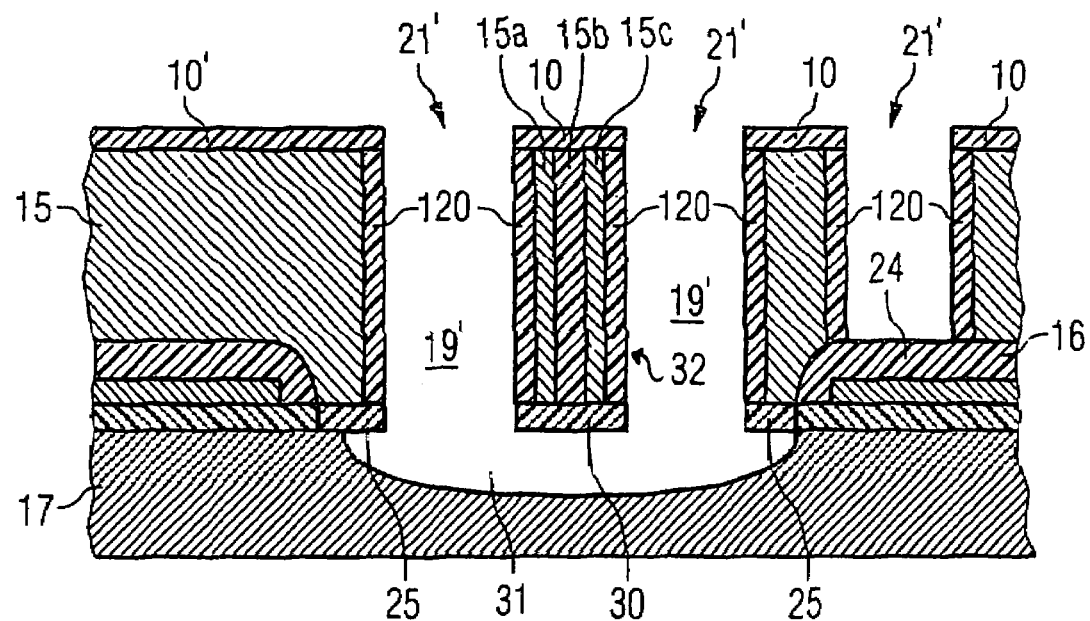
FIG. 2 shows a schematic representation of a second example embodiment of a micromechanical component according to the present invention.

FIG. 2 illustrates a second example embodiment of a micromechanical component according to the present invention.

In the second embodiment shown in FIG. 2, region 15b having isolation oxide 20 is situated within movable structure 32. The manufacturing is carried out analogously to the exemplary embodiment in accordance with FIGS. 1a through g. Silicon regions 15a, 15b, as well as isolation oxide 20, in particular, are protected during the isotropic etching step to produce undercut-etching region 31, by region 30 of second insulating layer 14 within movable structure 32.

Thus, a process for producing the first or second example embodiment of the micromechanical component of the present invention generally provides for first placing the required isolation trenches 19 in active silicon layer 15. For this purpose, using the silicon deep-etching method at those locations where an isolation is required, trenches are anisotropically etched in up to oxide stop layer 14 or 16.

These trenches are subsequently refilled with at least one isolation oxide ($SiO_2$), possibly together with other refill materials, such as polysilicon. This is deposited over the entire surface, in order to at least partially fill the trenches, e.g., only in the upper part. In the above described, example embodiment of FIG. 2, the trenches are completely filled.

The filling material ($SiO_2$ or some other material, such as AlN or the like) is again ablated from the wafer surface, e.g., in a surface planarization process using polishing or chemical-mechanical polishing (CMP), or etching. Thus, the material remains in the isolation trenches and is again ablated at the remaining locations during the planarization step, to the silicon surface. In this manner, a planar wafer surface of silicon regions is formed, having filled isolation trenches throughout at the designated locations. In the above examples, care is taken during the planarization step to ensure that the refill material in the isolation trenches terminates flush with the silicon surface.

The surface micromechanics processing then follows, i.e., following deposition and delineation of the metallic coating, the sensor structures are etched into the silicon, the stop oxide in the trenches is selectively removed, the structural side walls are passivated (Teflon deposition, $SiO_2$ deposition), the passivation is selectively removed from the trench bottom, and, finally, the sacrificial silicon zones are selectively etched out due to the highly reactive fluorine chemistry of $ClF_3$, $BrF_3$, $XeF_2$, etc.

Following removal of the photoresist mask (if a resist mask had been used in the processing) and of the passivation layers, freely movable surface-micromechanical structure 32, made up of substructures which are electrically insulated from one another, is then available.

The following examples illustrate embodiments of the components according to the present invention, e.g., rotation-rate sensors.

Figure 3:
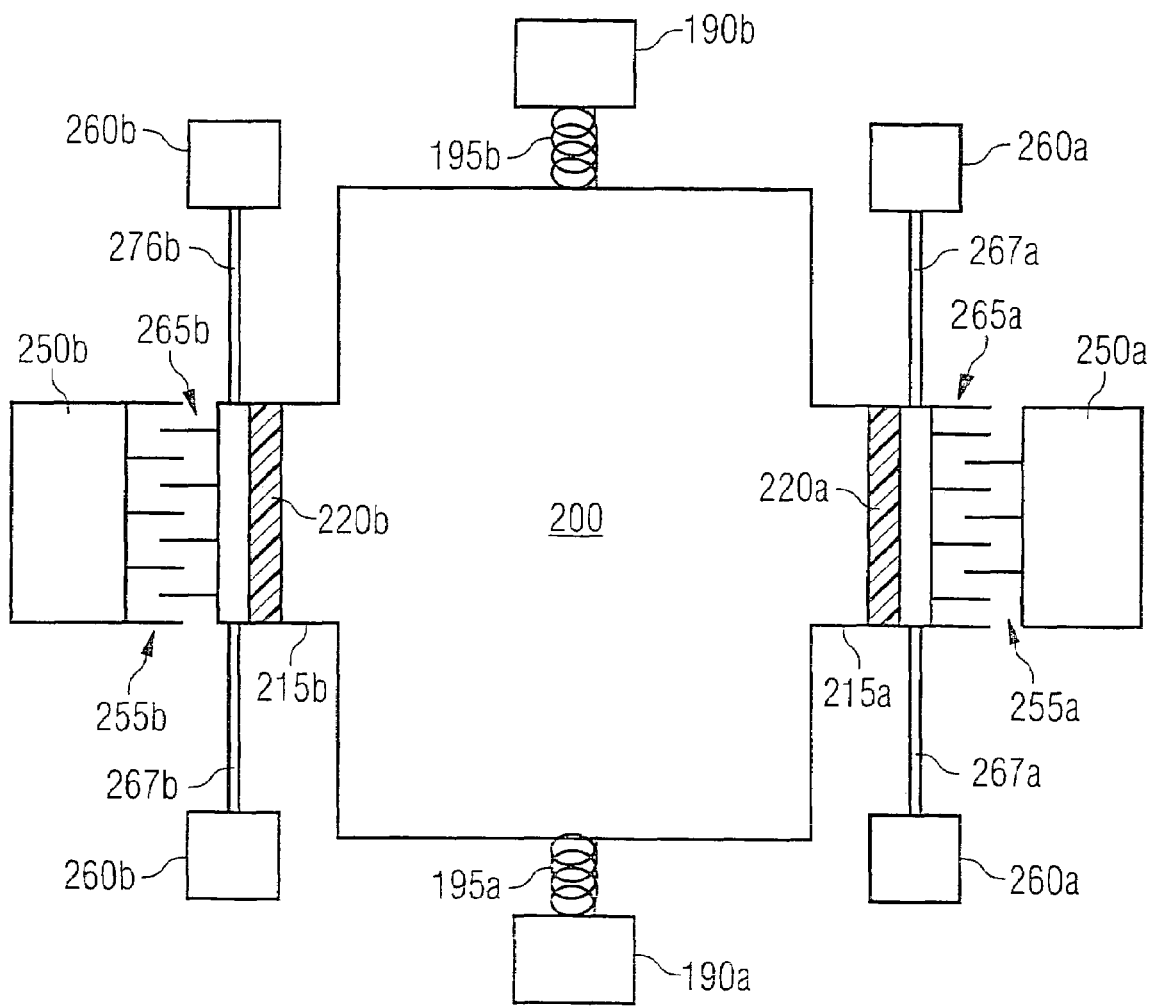
FIG. 3 shows a schematic representation of a sensor structure according to a third example embodiment of the present invention.
Figure 4:
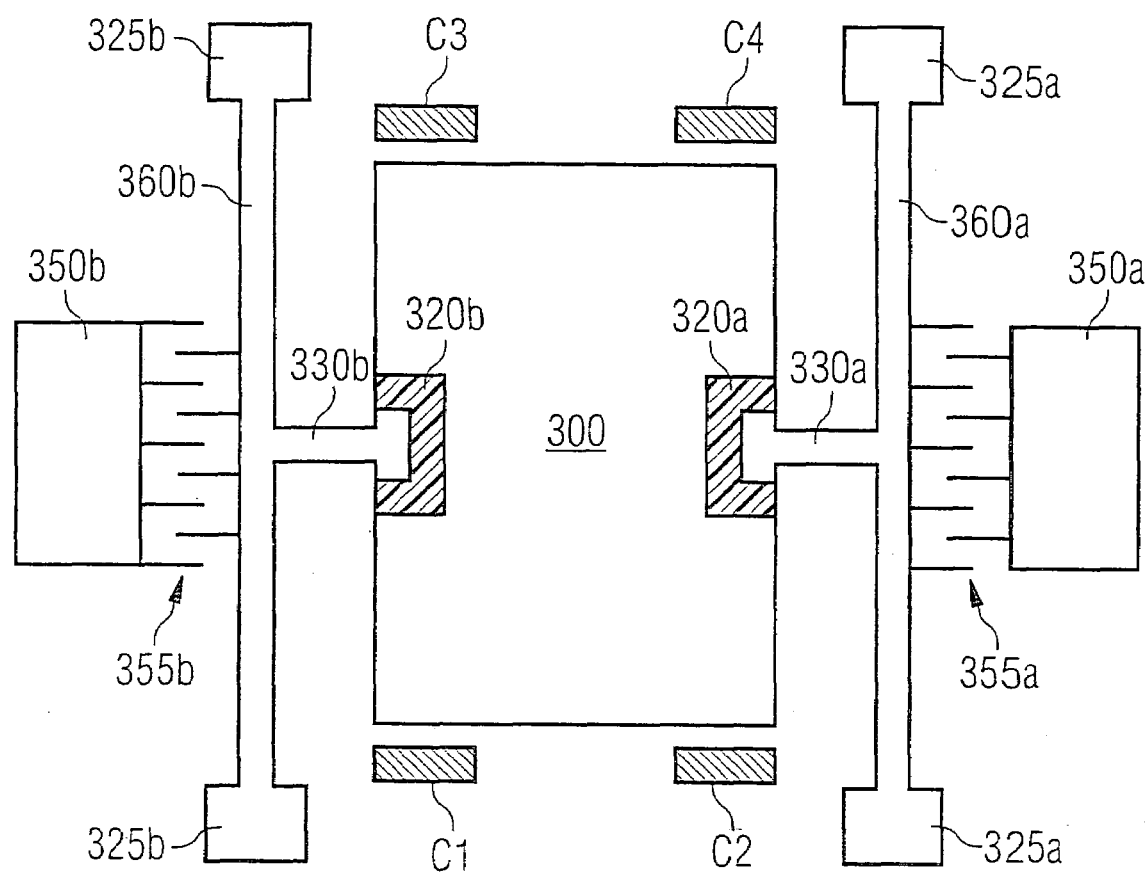
FIG. 4 shows a schematic representation of a further sensor structure according to a fourth example embodiment of the present invention.
Figure 5:
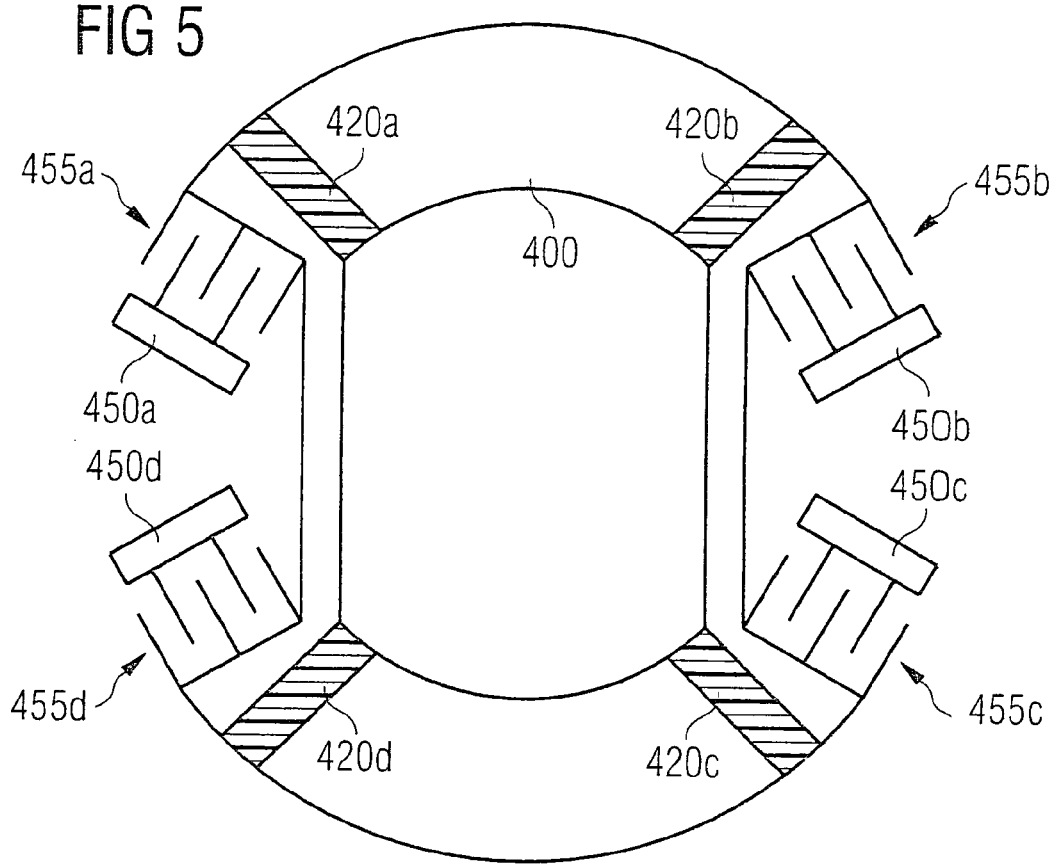
FIG. 5 shows a schematic representation of still another sensor structure according to a fifth example embodiment of the present invention.

FIGS. 3-5 illustrate various linear oscillator systems for rotation-rate sensing in accordance with third through fifth example embodiments, respectively.

In FIG. 3, reference numeral 200 denotes a seismic mass which has side arms 215a, 215b. When cross-referenced to FIGS. 1 and 2, seismic mass 200 is formed in micromechanical functional layer 15. In arms 215a, 215b of seismic mass 200, insulating regions 220a, 220b are provided, which electrically insulate the inner region of seismic mass 200 from the outer regions of arms 215a, 215b.

On the outer regions of arms 215a, 215b, comb structures 265a, 265b are provided, which cooperate with corresponding combs 255a, 255b that are permanently connected via anchors 250a, 250b to substrate 17 (see FIGS. 1 and 2).

In addition, 190a, 190b, 260a, 260b denote anchors which movably suspend seismic mass 200 over substrate 17 via torsion springs 195a, 195b and 267a, 267b, respectively.

Thus, FIG. 3 shows a seismic mass 200 or sensor oscillating mass, whose combs, which mesh into drive comb structure 255a,b, are electrically insulated from the remaining sensor oscillating mass. The drive substructure of the oscillating mass is contacted, for example, by anchors 260a,b, the remaining oscillating mass being used as sensing structure, via anchors 190a,b. In this connection, the sensing operation is carried out, for example, out-of-plane and capacitively using bottom electrode plates (not shown) which detect the distance of the remaining substructure of oscillating mass 200 to the bottom electrode plates. The feedover of the electric drive voltage via oscillating mass 200 into the detection electrodes is thus greatly reduced, and it is also advantageously possible for sensing to be carried at the remaining oscillating structure itself.

FIG. 4 schematically illustrates another sensor structure in accordance with a fourth example embodiment of the present invention.

In FIG. 4, reference numeral 300 denotes a seismic mass, which is connected via torsion springs 330a, 330b to movable bars 360a, 360b. Bars 360a, 360b are connected, in turn, via anchors 325a, 325b to substrate 17. In the edge area of seismic mass 300, in the area of the point of attachment of torsion springs 330a, 330b, insulating regions 320a, 320b are provided, which electrically insulate the inner region of seismic mass 300.

Connected to bars 360a, 360b, are comb structures 355a, 355b having combs which cooperate with corresponding combs provided on anchors 350a, 350b. Comb structures 355a, 355b are used for driving seismic mass 300. Via capacitor devices C1 through C4, displacements of seismic mass 300 are able to be capacitively sensed.

Thus, FIG. 4 shows a linear oscillator having planar detection. The drive structures are decoupled from the oscillating structures via torsion springs 330a,b. These are also electrically insulated from the actual oscillating structure. The rotation-rate signals are detected by capacitive structures C1-C4 against the oscillating structure or its stationary frame parts. The drive structure and the remaining oscillating structure may also be electrically contacted separately here, via separate mounting elements. This means that a connection for torsion springs must also be established on the mass.

FIG. 5 schematically illustrates still another sensor structure in accordance with a fifth example embodiment of the present invention.

In FIG. 5, 400 denotes another seismic mass which has a ring form. Here as well, at predefined locations, comb structures 455a-d are provided, which have combs that cooperate with corresponding combs that are connected via anchors 450a through 450d to substrate 17. Insulating regions 420a through 420d provide for a decoupling of the drive structures constructed in this manner, from the inner region(s) of seismic mass 400.

Thus, FIG. 5 illustrates a torsional oscillator, where the elements of the oscillating mass that mesh with the drive comb structures are electrically insulated from the remaining oscillating mass. The remaining oscillating mass and the drive parts are electrically contacted separately in each case (not shown). Here as well, the sensing operation is again preferably carried out out-of-plane using bottom electrode plates (not shown) to determine the distance of the remaining oscillating mass from the electrode plates.

Another component which is suited for application of the present invention is a micromechanical ring gyro featuring piezoelectric signal conversion.

Figure 6:
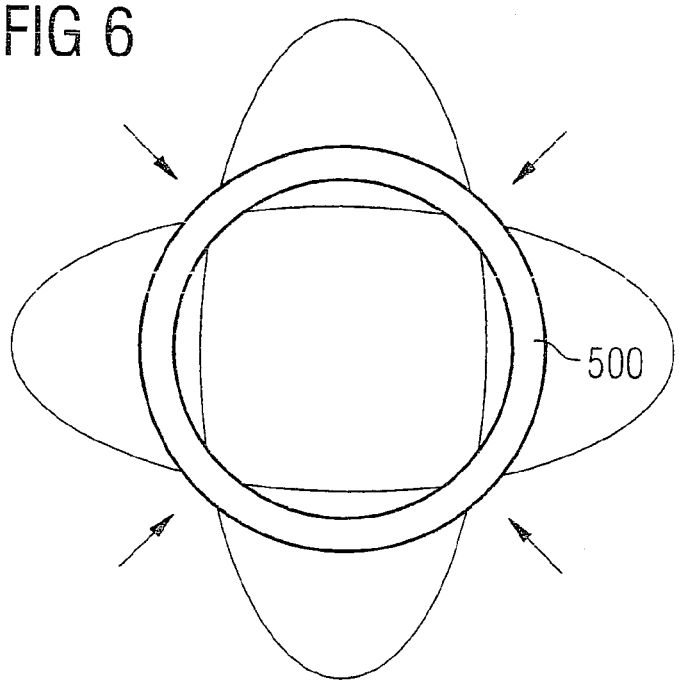
FIG. 6 shows a schematic representation of a ring gyro structure.

FIG. 6 is a schematic representation of a ring gyro structure having a deformable ring structure 500.

FIG. 6 shows modal shapes of ring structure 500, including the two modal shape limits. The one "dead point" of the motion is the perpendicular cigar shape, the other "dead point" of the motion is the horizontal cigar shape. The arrows mark the nodal points of this oscillation mode, i.e., locations without significant motional amplitude. Since the ring is, or is supposed to be, isotropic, in principle, the oscillation mode may also assume any other position in the plane. The mode orientation in the plane is typically derived from the oscillation driving state which breaks the rotational symmetry of the system and effects momentary main axes.

In response to a rotation of oscillating ring 500 about an axis at right angles to the ring plane, the oscillation resists the rotation, so that a motional amplitude occurs in the preceding nodal points of the oscillation mode. The turning away of the basic mode is typically adequately sensed in the nodal points, i.e., compensated by an electromechanical negative feedback. The level of the compensation signal is the measure most used for the rate of rotation of ring 500 and is the measured quantity that is actually of interest. Thanks to their high degree of internal symmetry, ring gyros are very insensitive to external disturbance variables. The resolution is able to be enhanced considerably. Typical embodiments employ either magnetic induction loops in an external magnetic field for driving and detecting the oscillation mode, or piezoelectric driving and detection elements which are soldered to the periphery of a precision ring or cylinder.

In the past, attempt has been made to operate micromechanical ring gyros using electrostatic driving and capacitive detection structures. Since comb structures substantially interfere with the symmetry of the ring and would, thus, negate the advantages of the structure, only simple capacitor plates come into consideration. These necessitate very high structures having very high aspect ratios, which can only be practically produced by using the LIGA technique, in the form of metallic primary sensor structures. However, the LIGA technique is not suited for industrial applications and is far too expensive, especially when primary structures are concerned; in practice, the technique of electroforming and replicating such structures fails because of the high aspect ratios.

The present invention provides a suitable technique for producing micromechanical, e.g., surface-micromechanical, silicon ring gyros, which supply driving forces, as well as detection signals, of sufficient magnitude, without affecting the symmetry of the ring structure essential to functioning. It makes it possible to connect micromechanical, e.g., surface-micromechanical, silicon ring gyros to piezoelectric driving and detection fields and, in this way, to obtain substantial driving forces and useful signals of considerable magnitude, when working with a relatively low source impedance.

The method according to the present invention makes it possible to manufacture freely movable sensor substructures which are electrically insulated from one another. Previously placed trenches are filled with piezoelectric material and subsequently planarized. The actual silicon structures are subsequently produced by etching trenches. The isotropic gas-phase etching technique makes it possible, by employing silicon sacrificial layers, to fabricate self-supporting, oscillatory structures, without damaging functional dielectrics or piezoelectrics.

Figure 7:
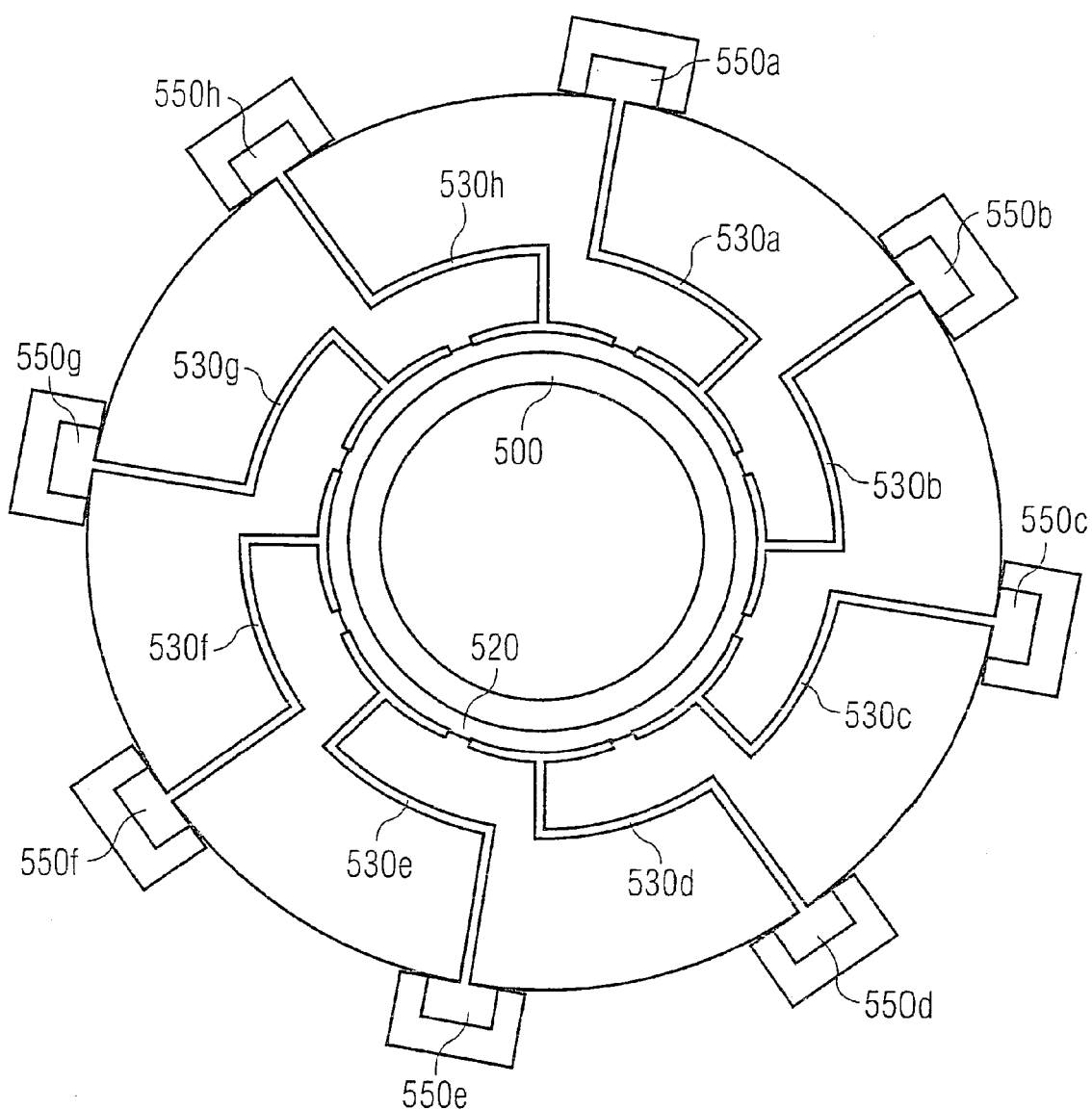
FIG. 7 shows a schematic representation of a ring gyro structure in accordance with a sixth example embodiment of the present invention.

FIG. 7 shows a schematic representation of a ring gyro structure in accordance with a sixth example embodiment of the present invention.

In FIG. 7, 520 denotes a circumferential piezoelectric layer, which is introduced in functional layer 15 shown in FIG. 1 or 2 in accordance with one embodiment of the method of the present invention. Reference numerals 530a through 530g denote torsion springs of conductive polysilicon, which are provided adjacently on piezoelectric layer 520. Numerals 550a through 550h denote anchors which fix torsion springs 530a through 530h.

To produce the ring gyro according to FIG. 7, after applying the underlying layer system of insulating layers and the superjacent active silicon layer or functional layer, a ring-shaped trench is exposed around the later silicon ring structure 500. This trench is filled with piezoelectric material 520, and the wafer surface is subsequently planarized. The actual silicon structures are subsequently produced by etching trenches, i.e., out of the still substantially cohesive surface silicon layer. This relates to inner ring (actual ring oscillator) 500, anchors 550a-h, and torsion springs 530a-h for central ring 500, which simultaneously supply the electrode voltages to the corresponding contact elements and, respectively, tap off the electrode voltages from the same.

FIG. 7 shows a continuous piezoelectric layer 520 having delineated external silicon electrodes as ends of torsion springs 530a-h. As silicon base material, one may use heavily doped, highly conductive silicon of the p- or n-type, especially highly doped p-material having a boron doping.

Since piezoelectric layer 520 is designed as a continuous outer ring, this may lead to increased electric crosstalk between adjacent electrodes.

Figure 8:
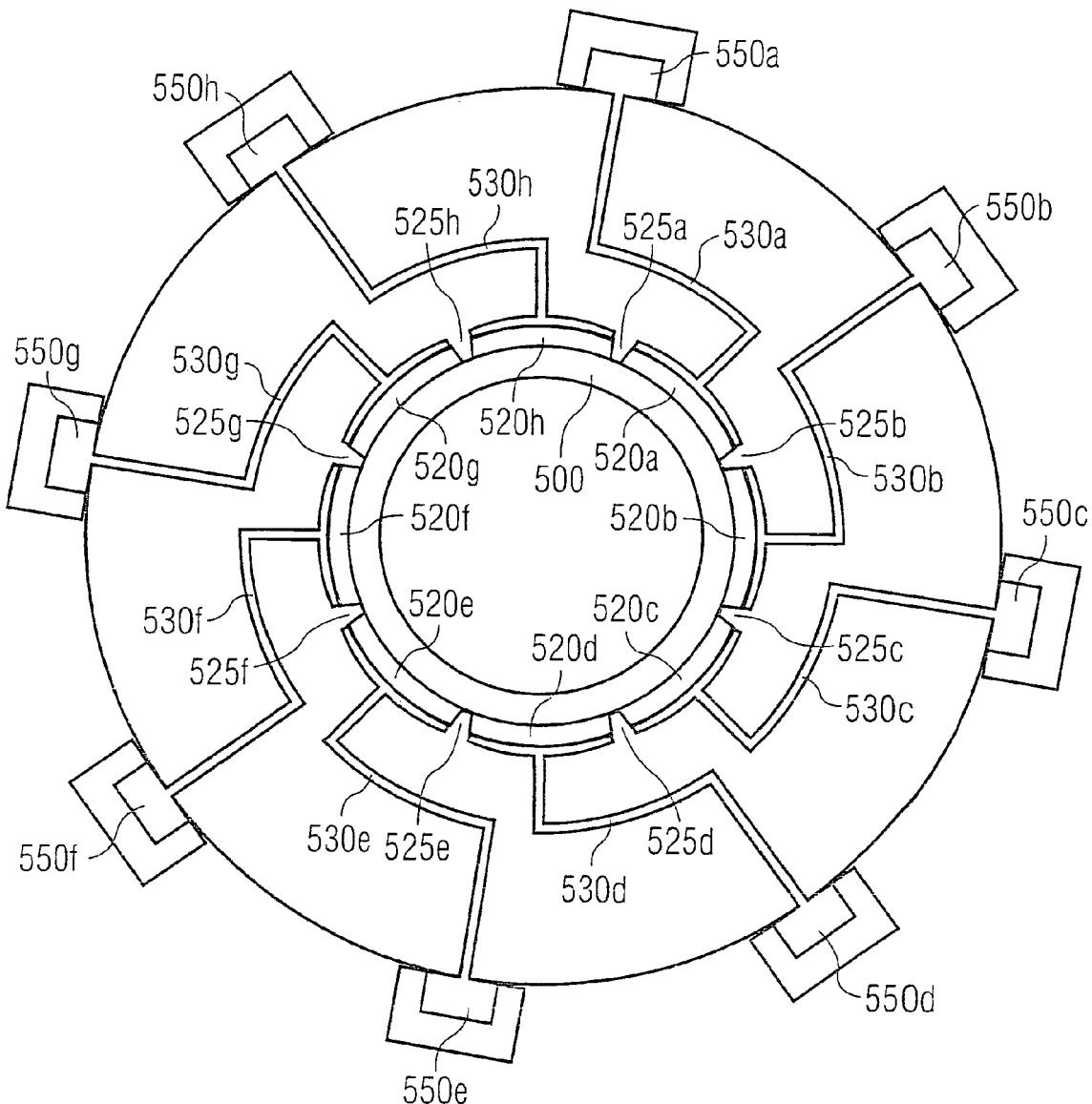
FIG. 8 shows a schematic representation of a ring gyro structure in accordance with a seventh example embodiment of the present invention.

FIG. 8 shows a schematic representation of a ring gyro structure in accordance with a sixth example embodiment of the present invention.

In accordance with FIG. 8, the piezoelectric fields are also isolated from one another. The isolation is brought about in that, initially for the refill operation, a continuous ring 520 is not produced, but instead eight ring segments 520a-g, which are separated from one another by cut-outs 525a-g, so that following the refill and planarization operations, eight piezoelectric partial segments, which are separated from one another, are thereby formed in turn. The benefit of this embodiment is that electric feedover, or leakage, between adjacent electrodes is reduced. However, open boundary regions of the piezoelectric material between the external electrodes and the central inner ring may occur.

For certain piezoelectrics (such as ZnO), for example, the occurrence of boundary conductance can cause electric shunts between the inner ring electrode and outer electrodes. Thus, the pattern delineation processes must be optimized in a way that minimizes ion damage to the greatest degree possible. A process that, in order to achieve an anisotropic etching result, makes do with only low ion energies which are not able to significantly damage the open boundaries of the piezoelectric fields satisfies this requirement.

Thus, the electrical connection of the external electrodes is achieved via the corresponding anchor and the corresponding spring, which must be sufficiently electrically conductive by heavy doping (p or n, preferably p). In principle, the need for directly contacting the inner ring is eliminated, when all drive signals are fed as complementary voltages to the external electrodes and all signal taps from the external electrodes take place in differential form.

For example, the oscillatory drive may be such that the drive field in the 12-o'clock position and the drive field in the 3-o'clock position are each driven by complementary voltage and, for purposes of oscillation detection, the output voltages of the fields in the 6-o'clock and in the 9-o-clock position are subtracted from one another. Analogously, the nodal motion may be measured by subtracting the output voltages of the two fields to the right and left of the 3 o'clock position from one another, and the nodal motion compensated by feeding the compensation voltage in complementary fashion into the piezoelectric fields to the right and left of the 9 o'clock position. In this manner, the central silicon ring, although not directly electrically contacted, always remains at a virtual zero potential.

Also useful is a laminate structure which also permits the central ring to be directly contacted via an Al conductor path. To this end, before the deep-trench process for working out the active structures, an isolation oxide layer is deposited over the spring ribs and delineated. An Al layer is then deposited over this and patterned to form conductor paths. The conductor paths each contact the central silicon ring and allow the ring to be connected to a defined potential, e.g., ground potential or a reference potential. In order for the oscillatory motion to be affected to the least possible extent, the Al conductor paths should be selected to be as thin as possible, e.g., only 50-200 nm thick. For this reason, it is advantageous to provide all spring ribs with a conductor path whose purpose is to provide a connection to the central ring structure (although it would suffice, if one were to use only one single spring rib for contacting the inner ring). By utilizing all spring ribs, an electric parallel connection of all eight conductor paths is achieved, and one gets by with thinner conductor paths. Moreover, quite importantly, the symmetry of the system is also retained (all spring ribs are the same).

One derives the further advantage of being able to polarize piezoelectrics very effectively, as required, for example, for PZT materials. Following deposition, delineation, and firing of the PZT ceramic, these materials must first be prepolarized by applying a pole voltage—a high d.c. voltage—between the outer electrode and inner ring, at an elevated temperature, and thus be made piezoelectric. This polarization is able to be carried out in a particularly well-defined manner by individually connecting the inner silicon ring to each electrode field. One also derives the benefit of a further reduction in the electric feedover, or leakage, between adjacent electrode fields.

Thus, it is possible to create a micromechanical component, e.g., a surface-micromechanical ring gyro, which overcomes the known problem of capacitive/electrostatic readout, in that piezoelectric fields are able to be implemented in a new manufacturing process according to the present invention. The process control enables micromechanical structures to be exposed without damaging functional dielectric or piezoelectric layers. Thus, in conjunction with a trench/trench-refill technique, vertically structured piezoelectric fields may be created on an oscillatory silicon ring.

The advantages of the piezoelectric signal conversion are comparatively large signal voltages and low source impedances, sensing of mechanical stresses and strains instead of motional amplitudes, and low space requirements in comparison to capacitive structures.

Although the present invention is described above on the basis of exemplary embodiments, it is not limited thereto, and may be modified in numerous ways.

In particular, the present invention is not limited to the illustrated applications. Another application example would be a microswitch, for example, analogous to conventional relays, the actuator part ideally being completely galvanically decoupled from the actual switch part.

Instead of simple insulating regions, any other desired functional regions may be introduced, for example for detecting mechanical forces using piezoelectric effects (by ZnO, AlN, PZT . . . ) or for integrating piezoelectric actuators in the structures. In any case, the novel process control makes it possible for a multiplicity of new types of surface-micromechanical components to be produced.

In addition, the protective layer for the sacrificial-layer etching technique may initially be deposited in the entire trench and then be removed from the trench bottom.

Alternatively to a mechanical polishing step, one may also use a known plasma-planarization method (provided that the refill material is removable in the plasma), or a back wet-etching technique.

What is claimed is:

1. A micromechanical device, comprising:
   a substrate;
   a micromechanical functional layer of a first material provided over the substrate, the functional layer having a first region and a second region, wherein the first and second regions are connected by a third region of a second material; and
   an insulating layer provided between the substrate and the functional layer;
   wherein at least one of the first, second and third regions is part of a movable structure that is suspended over the substrate, and wherein the first material is polysilicon, and the second material is an insulating material, and wherein the second material is a piezoelectric material.

2. A micromechanical device, comprising:
a substrate;
a micromechanical functional layer of a first material provided over the substrate, the functional layer having a first region and a second region, wherein the first and second regions are connected by a third region of a second material; and
an insulating layer provided between the substrate and the functional layer;
wherein at least one of the first, second and third regions is part of a movable structure that is suspended over the substrate, and wherein the first material is polysilicon, and the second material is an insulating material, and wherein a seismic mass is formed in the functional layer, and a comb structure is provided as a driving mechanism, and wherein the third region electrically insulates the comb structure from the seismic mass.

3. A micromechanical device, comprising:
a substrate;
a micromechanical functional layer of a first material provided over the substrate, the functional layer having a first region and a second region, wherein the first and second regions are connected by a third region of a second material; and
an insulating layer provided between the substrate and the functional layer;
wherein at least one of the first, second and third regions is part of a movable structure that is suspended over the substrate, and wherein the first material is polysilicon, and the second material is an insulating material, and wherein a ring structure is formed in the functional layer, and wherein the third region is formed as a piezoelectric region.

4. The micromechanical device according to claim 3, wherein the ring structure is surrounded by the third region, and wherein a plurality of torsion springs are connected to the third region.

5. The micromechanical device as recited in claim 3, wherein the ring structure is surrounded by the third region, the third region having a plurality of sub-sections that are not interconnected, and wherein one of a plurality of torsion springs is connected to each sub-section.

6. The micromechanical device according to claim 3, wherein the ring structure is part of a ring gyro.

7. A method for manufacturing a micromechanical device, comprising:
providing a substrate;
providing a micromechanical functional layer of a first material over the substrate, wherein the first material is polysilicon;
providing an insulating layer between the substrate and the functional layer;
forming a trench in the functional layer that subdivides the functional layer into a first region and a second region;
filling the trench with a second material to form a third region, wherein the third region connects the first and second regions;
planarizing the resulting structure; and
forming a movable structure in the functional layer, the movable structure being suspended over the substrate, wherein at least one of the first, second and third regions is part of the movable structure.

8. The manufacturing method according to claim 7, further comprising:
providing an uninterrupted, traversing trench in the functional layer to form the movable structure;
coating the side walls of the traversing trench with a protective layer;
providing an undercut etching region to render a part of the functional layer movable;
wherein the undercut etching region is protected by the insulating layer, and the side
walls of the traversing trench are protected by the protective layer.

9. The manufacturing method according to claim 8, wherein the protective layer is initially deposited in the entire traversing trench and then removed from the trench bottom.

10. The manufacturing method according to claim 7, wherein the planarization is carried out by using a chemical-mechanical polishing step.

* * * * *